United States Patent
Avasarala (10) Patent No.: US 9,165,785 B2
(45) Date of Patent: Oct. 20, 2015

(54) REDUCING BOWING BIAS IN ETCHING AN OXIDE LAYER

(71) Applicant: TOKYO ELECTRON LIMITED, Tokyo (JP)

(72) Inventor: Bharat K. Avasarala, Albany, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/196,314

(22) Filed: Mar. 4, 2014

(65) Prior Publication Data

US 2014/0295668 A1 Oct. 2, 2014

Related U.S. Application Data

(60) Provisional application No. 61/806,561, filed on Mar. 29, 2013.

(51) Int. Cl.
*H01L 21/3065* (2006.01)
*H01L 21/311* (2006.01)
*H01L 21/3213* (2006.01)
*H01L 49/02* (2006.01)

(52) U.S. Cl.
CPC .... *H01L 21/31116* (2013.01); *H01L 21/31144* (2013.01); *H01L 21/32137* (2013.01); *H01L 28/90* (2013.01)

(58) Field of Classification Search
None
See application file for complete search history.

(56) References Cited

U.S. PATENT DOCUMENTS

| | | | | |
|---|---|---|---|---|
| 5,296,095 A * | 3/1994 | Nabeshima et al. | | 216/67 |
| 5,972,799 A * | 10/1999 | Koshiishi et al. | | 438/723 |
| 6,074,957 A * | 6/2000 | Donohoe et al. | | 438/723 |
| 6,093,655 A * | 7/2000 | Donohoe et al. | | 438/717 |
| 6,117,786 A * | 9/2000 | Khajehnouri et al. | | 438/700 |
| 6,228,775 B1 * | 5/2001 | Coburn et al. | | 438/714 |
| 6,506,674 B2 * | 1/2003 | Ikeda et al. | | 438/637 |
| 6,921,725 B2 * | 7/2005 | Donohoe | | 438/723 |
| 7,033,954 B2 * | 4/2006 | Donohoe | | 438/723 |
| 7,998,869 B2 * | 8/2011 | Jeon et al. | | 438/700 |
| 8,614,151 B2 * | 12/2013 | Benson et al. | | 438/720 |
| 2002/0173162 A1* | 11/2002 | Liu et al. | | 438/732 |
| 2003/0155329 A1* | 8/2003 | Su et al. | | 216/67 |
| 2009/0081876 A1 | 3/2009 | Bera et al. | | |
| 2012/0068366 A1* | 3/2012 | Kiehlbauch et al. | | 257/798 |
| 2014/0357080 A1 | 12/2014 | Lisi et al. | | |

* cited by examiner

*Primary Examiner* — Allan Olsen
(74) *Attorney, Agent, or Firm* — Rothwell, Figg, Ernst & Manbeck, P.C.

(57) ABSTRACT

An etching method in which bowing or lateral etching is reduced or minimized, particularly with respect to bowing which can occur in etching of an oxide layer in high aspect ratio structures. It has been recognized that such bowing typically occurs in the upper portion of the oxide layer in terms of its location, but that the timing at which the bowing occurs is during the etching of the lower regions of the oxide layer and also during etching of a poly-Si or SOI layer located under the oxide layer. In a preferred form, a thicker passivation layer is formed in the upper region of the oxide layer and a thinner passivation layer is formed when etching the lower portion of the oxide layer or deeper in the etch trench. As a result, reduction in the passivation layer in the upper region which can occur during etching of the lower or deeper region of the trench can be accommodated by the increased thickness passivation layer. In addition, the bowing can be additionally reduced by accelerating the poly-Si or SOI etch, for example, by poly-Si simultaneously using both argon and nitrogen during the etch.

18 Claims, 4 Drawing Sheets

| nm | Partial Ox | Post Oxide | Post SiN | Post SOI | Post BOX |
|---|---|---|---|---|---|
| Bow Bias | 3nm | 11nm | 20nm | 41nm | 41nm |

Bow Bias = Bow CD − Top CD

Depo rich: Bow CD 110nm

Depo less: Bow CD 120nm

REDUCING BOWING BIAS IN ETCHING AN OXIDE LAYER

CROSS REFERENCE TO RELATED APPLICATIONS

This application claims priority to provisional application 61/806,561 filed Mar. 29, 2013, the entirety of which is incorporated herein by reference.

FIELD OF THE INVENTION

The invention relates to fabrication of electronic devices such as semiconductors, and particularly to a method for reducing bowing in etching to form such devices. The invention can be particularly advantageous in manufacturing memory devices.

BACKGROUND OF THE INVENTION

Fabrication of semiconductor devices involves multi-step processes of forming features on a semiconductor substrate. Steps can include material growth, patterning, doping, deposition, etching, metallization, planarization, and so forth. Techniques herein relate to etching features in semiconductor substrates. Such features can include trenches, vias, through-silicon-vias, and other patterns etched in wafers or other substrates. Etching of substrates typically involves using a plasma processing system. Plasma processing systems create a plasma above a substrate by supplying power to a process gas. Various species from the plasma can then be used to etch features into a substrate.

Figure 1:
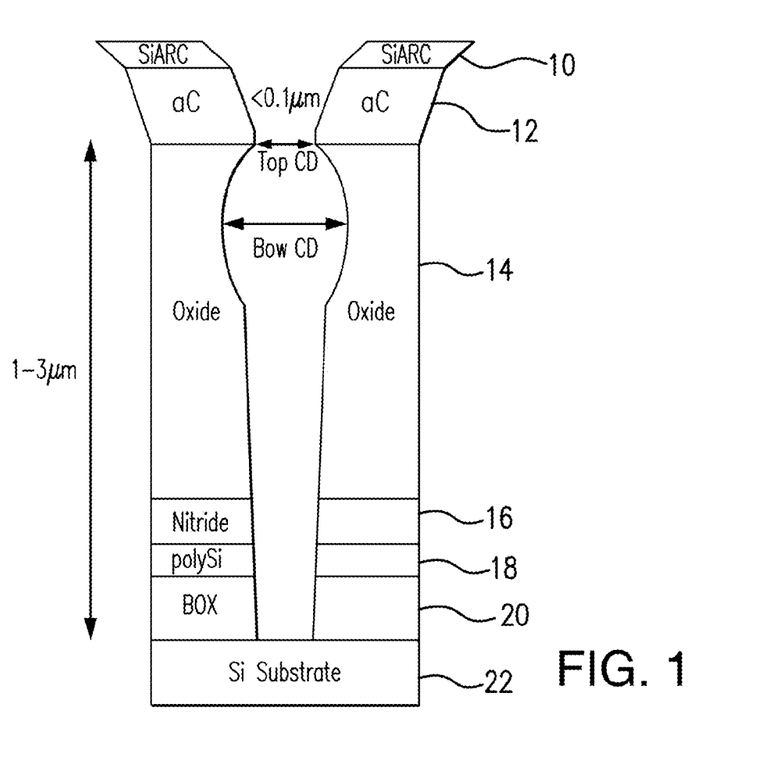
FIG. 1 is a cross-section of an example of an etched substrate to which the present invention can be applied.

One challenge with etching features—especially deep (high aspect ratio) features—is controlling and limiting a bowing effect that enlarges trench diameters or widths, such as bowing in an oxide layer of a deep trench capacitor or other feature device. A typical example of bowing is shown in FIG. 1. Bowing is an enlargement of a hole or trench diameter (hole width), for example, in an upper part of an oxide layer of a given hole feature such as a deep trench.

Ideally, for many etch processes, the diameter of the trench should remain constant for an entire depth of the trench. However, diameter consistency of trenches is difficult to achieve. Accordingly, bowing becomes undesirable and a significant challenge for etching, including etching of high aspect ratio deep trench masks. A consequence of an enlarged bowing diameter is that adjacent trenches can merge leading to electrical shorts. An example of trench merging can be seen in FIG. 2. Merged trenches can also cause irregular flow of etchants along the trenches and can adversely affect ion scattering of ion-based etching, leading to defects such as "side-pockets" in deep trenches during the Si (silicon) substrate etch process (which can follow a mask open process).

SUMMARY OF THE INVENTION

Some etch processes involve etching through multiple layers of different materials. FIG. 1 depicts bowing within a trench occurring at an upper portion of an oxide layer. It has been recognized that bowing progression is not limited to occurring during etching of the oxide layer, additional bowing can occur during etching of layers that are present underneath the oxide layer. In many cases, bowing occurs predominantly in the upper-most region of the trench oxide layer. However, bowing progression of the oxide layer is often at a maximum during the etching of the polysilicon layer (when the etch gases used for the latter involve argon and nitrogen).

Figure 3:
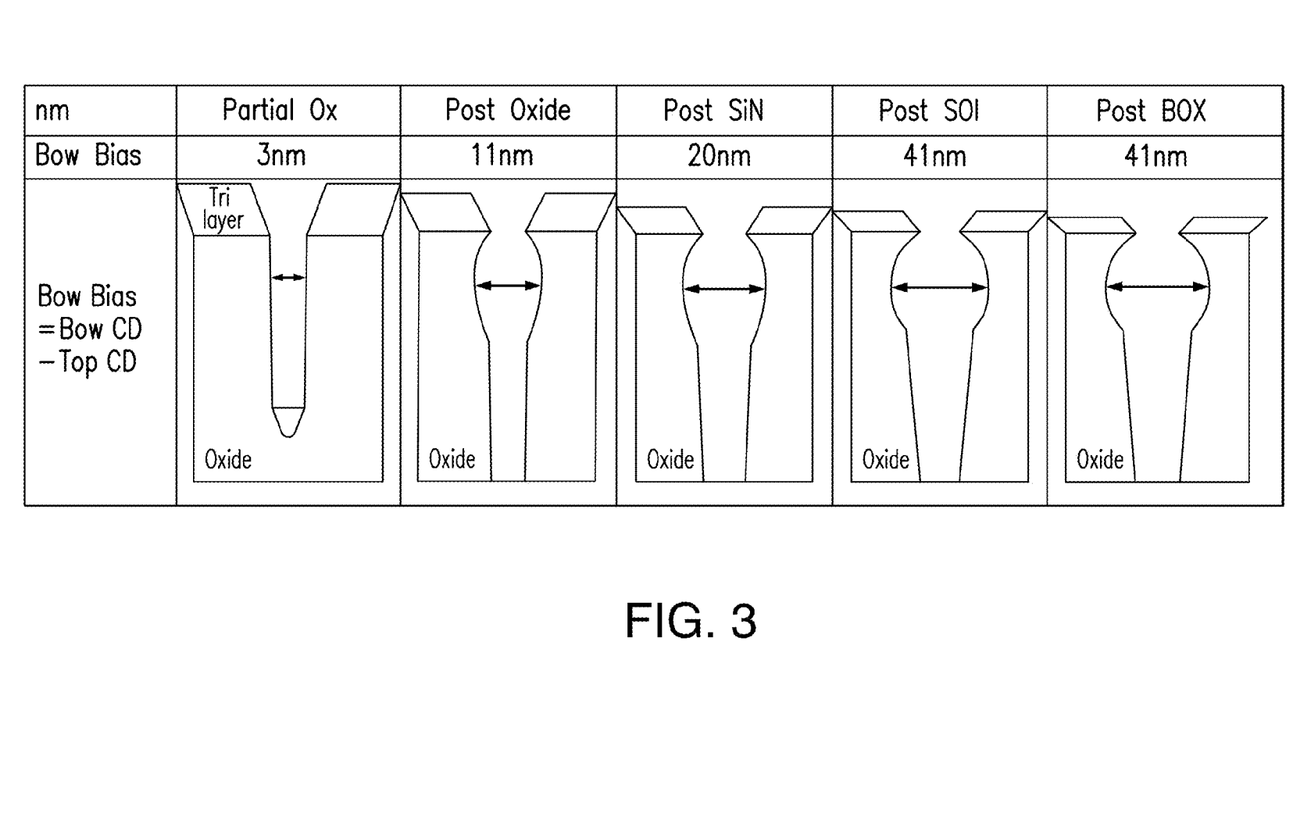
FIG. 3 illustrates a bow bias that occurs at different stages of an etch process.

As shown in FIG. 1, the polysilicon layer lies under the oxide layer (with a nitride layer in between). FIG. 3 illustrates a bow critical dimension (CD) as etching progresses layer after layer. As can be observed, and as discussed in further detail hereinafter, the maximum increase in Bow CD can occur during the etching of the polysilicon or poly-Si layer (or silicon on insulator, SOI) etch. The increased lateral etching during etching of the poly-Si layer can be in part due to ion bombardment from un-scattered ions. An angle of incidence that leads to un-scattered ions can be dependent on a mask thickness and mask faceting. Typically there is some amount of lateral etching during etching of any given layer. Because of the increased lateral etch during the poly-Si etch, the conventional sidewall passivation becomes insufficient to protect the trench from bowing.

Conventional techniques to address this bowing involve increasing flow of polymerizing gas during oxide etch. A polymerizing fluorocarbon gas such as $C_4F_6$ can protect the mask above oxide layer. This can result in a better control of the angle of incidence of ions in the upper part of the trench in the oxide region. Unfortunately, increasing the flow of the polymerizing gas can also lead to a decrease in trench diameter and even etch stop. Conventional techniques also fail to recognize or address increases in bowing that can occur in etching multiple layers between the oxide layer and the silicon substrate. Some conventional techniques include increasing mask thickness above the oxide layer, but this is undesirable because many processes/design parameters specify decreased thicknesses of amorphous carbon and SiARC layers above the oxide.

The invention decreases the bowing profile without adversely affecting the trench diameter or causing etch stop. For example, bowing in an oxide layer of a multi-layer stacked trench capacitor can be reduced by process changes (of gas chemistry) in poly-Si or SOI layers underneath it. For example, techniques can include altering gas chemistry (Nitrogen and Argon) that is contributing to the ion-etching of poly-Si (or SOI) layer without altering diameters of other layers in the trench. Flow rates of nitrogen and argon and the ratio of nitrogen to argon can also be controlled. The invention also includes selectively altering gas chemistry to increase sidewall passivation at a specific location without closing off a trench.

DETAILED DESCRIPTION OF PREFERRED EMBODIMENTS

Techniques disclosed herein include systems and methods for reducing bowing bias in an oxide layer during etching of multi-layered deep trenches using targeted over passivation of sidewalls. In plasma etching, the substrate is placed on a substrate holder of a process chamber, and gases (forming the process chemistry) are supplied to the process chamber. In addition, power (e.g. RF power) is applied to one or more electrodes to form a plasma.

A deep trench mask open process involves etching through various layers of a given substrate stack. The stack can include layers such as: SiARC (Silicon anti-reflective coating), amorphous carbon (aC), oxide, nitride, polysilicon, buried oxide, and a silicon substrate. Oxide etch is mainly an ion-assisted process. Ions are bombarded onto a reactive surface of the oxide layer leading to an anisotropic etch. To protect sidewalls from etching, fluorocarbon based gases are used for passivation.

Bowing primarily occurs in an upper part of the oxide layer. Bowing can in part be due to mask erosion and/or mask faceting. With mask erosion, if the mask above an oxide layer erodes (i.e., decreases in thickness and/or increases in hole diameter) as etching progresses, the ions striking the trench tend to be incident on the bow area of the oxide layer. Ions then etch away the sidewall passivation in the upper part of the trenches leading to a lateral etch. With mask faceting, there are SiARC and photoresist layers on top of the amorphous carbon layer, and the combined stack acts as a mask for etching the oxide and the remaining layers. As the mask erodes, various facets are formed on these layers, and these facets tend to influence the incident angle of the incoming ions. The faceting and change of the incidence angle and scattering of the ions can result in striking of ions in the upper part of the trenches causing bowing.

Although reducing mask erosion and faceting can be beneficial, techniques herein primarily address reducing the effect of ion bombardment on the oxide layer, without substantially altering or performing processes directed toward altering the mask. It is to be understood that the techniques disclosed herein could be used in combination with mask modification techniques, however the techniques herein do not require mask modification as mask modification is often undesirable (or not allowed to be varied as a process modification).

Figure 4A:
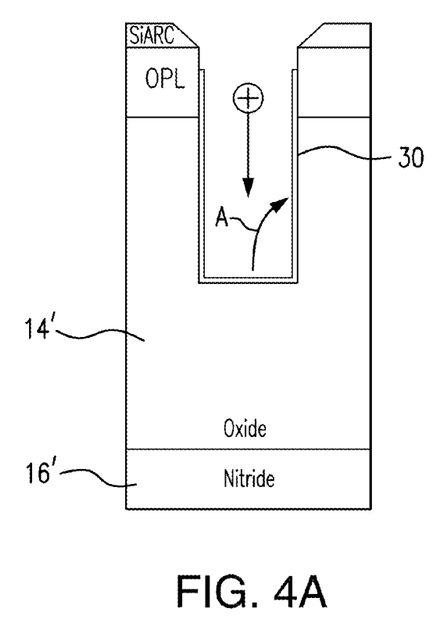
FIGS. 4A and 4B illustrates the forming or progression of forming of a bowed portion in etching an oxide.
Figure 4B:
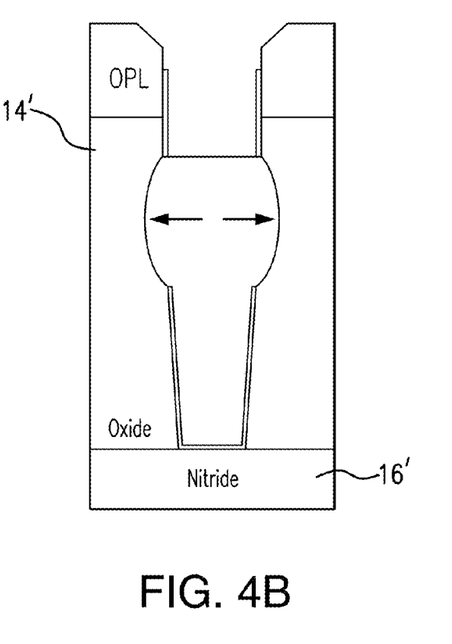

As shown in FIG. 4A, bowing in the oxide layer is insignificant when a partial oxide etch profile is observed. In this case, when ions interact with the reactive surface, the polymer is removed and sticks to the sidewalls. As the etch proceeds further, as seen in FIG. 4B, sidewall deposition is not uniform down the oxide trench. The cumulative deposition at the lower part of the oxide trench results in thicker sidewall passivation. Similarly, the incident deposition leads to a thicker sidewall on the trench portion that is above the oxide layer (FIG. 4B). But the upper part of the trench in the oxide layer has the least amount of sidewall passivation thickness and is constantly bombarded by un-scattered ions. The lower thickness of the sidewall passivation and the lateral etch due to ion bombardment contributes to the bowing profile.

Processes herein selectively increase sidewall passivation in the uppermost part of the oxide layer. For example, the present invention recognizes that bowing typically occurs within a region of about 150 nm in thickness from the top of the oxide layer in the trench. The oxide layer etching step is then divided in such a way that the top 150 nm of the oxide layer has a different etch chemistry as compared to the etch chemistry used for etching the rest of the oxide layer.

A polymerizing fluorocarbon gas can be added or increased during the initial 150 nm of oxide layer etch such that the net result is an increase in deposition (deposition-rich) on the sidewalls in this portion of the oxide etch. This increases the sidewall passivation in the upper part of the oxide layer. The remaining oxide layer is etched in such a way that the polymerizing and etching gas are balanced to give a net etch (a non-rich chemistry).

Figure 5A:
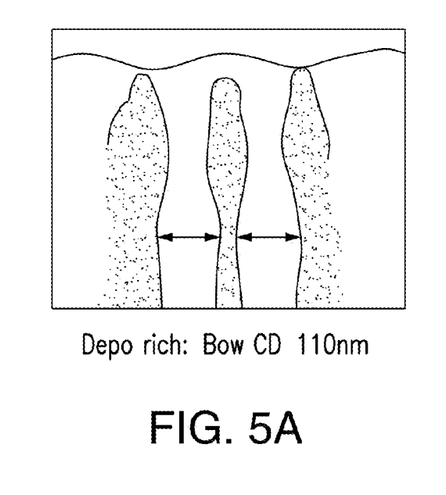
FIGS. 5A and 5B illustrate an etch with a deposition rich or thick passivation layer in initial etching and an etch without a deposition rich or thin passivation layer.
Figure 5B:
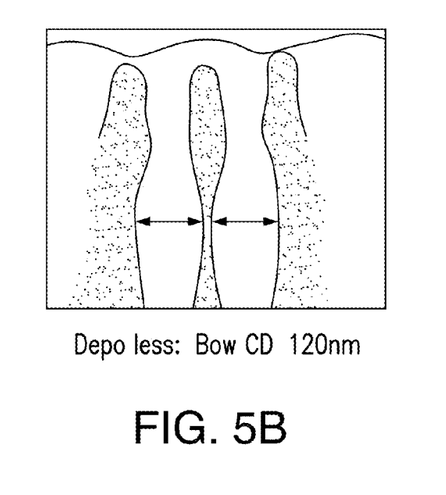

As seen in FIG. 5A, the bow CD decreases when the deposition rich chemistry is used in the upper part of the oxide trench etch. When no deposition rich chemistry is used for the upper part of the trench, then the resulting bow CD is worse as shown in FIG. 5B.

Bowing in the oxide layer increases as the etch proceeds through various layers. Of all the layers that are etched, bowing increases significantly during the poly-Si layer etch. Poly-Si etch is usually a radical-assisted process. In accordance with an additional advantageous feature, in the etch chemistry during the poly-Si etch, $N_2$ and Ar are present at the same time. These gases help in increasing the etch rate of poly-Si and causing a breakthrough in the layer. Techniques include modifying a ratio of $N_2$ to Ar in the total gas flow. The ratio of $N_2$ to Ar in the etch chemistry of poly-Si is a beneficial parameter that can be used to control the bowing in the oxide layer.

Preferably, by etching the poly-Si layer using both Ar and N simultaneously, the contribution to possible bowing in the oxide layer is suppressed. Thus, in combination with the use of a thicker passivation layer during the initial etching of the oxide layer, the additional use of both Ar and N simultaneously in etching the poly-Si layer is particularly effective in reducing or minimizing the bowing in the oxide layer. In addition, the ratio of nitrogen to argon should be controlled to provide an advantageous etching speed of the polysilicon, while also not using excessive amounts of argon, which could cause undesirable ions. In accordance with the invention, the ratio of nitrogen to argon is preferably about 0.12 to 2.0. More preferably, the ratio of nitrogen to argon is about 0.2 to about 0.8 when etching the polysilicon layer beneath the oxide layer.

Figure 2:
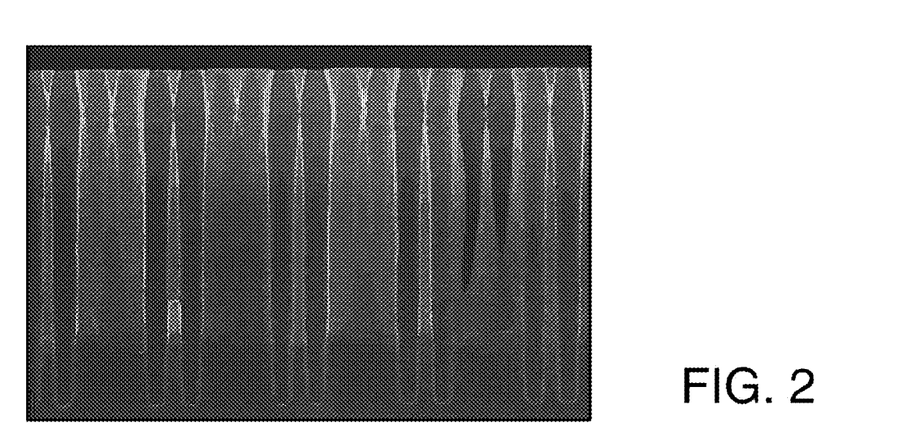
FIG. 2 is a SEM image showing that bowed portions of an etched oxide trench can contact each other.

The invention is especially useful for etching deep features. For example, when etching through a deep trench (high aspect ratio), the top opening of the trench can be about 100 nm or less while the depth is close to 3 microns (3000 nm). Thus, the invention can be advantageously used with high aspect ratio features such as a trench with an aspect ratio equal to or greater than about 30, and even trenches with an aspect ratio greater than 40. Such trenches can be used, for example, for memory applications. In such applications there can be a very dense forest of these trenches. By way of a non-limiting example, there can be 10,000 trenches in rows and columns in a single semiconductor die. A frequent problem with such a density of trenches is having adjacent trenches that merge during the etching process. When trenches merge they can short circuit. Short circuiting typically happens at later stages of fabrication when polysilicon is filled into these trenches to form capacitors. Many designs specify that a minimum of about 10 nanometers gap is needed between two trenches. The example in FIG. 2 illustrates a typical merging of trenches. In some cases the gap between trenches can be completely collapsed. That critical dimension is called the bow CD. Ideally the bow CD should be the same as the other CDs between trenches. Such CD uniformity is extremely difficult to achieve, and so it is desirable to at least reduce the bow CD.

As mentioned above, one of the features of the invention includes a determination or recognition of where most of this bowing is occurring and when during etching do more significant contributions to bowing occur. Although physically the bowing is occurring in the oxide layer, time-wise this bowing is occurring not only during the initial etch of the oxide layer. The bow bias gives a difference value between the top CD (the opening adjacent the mask at the top of the oxide layer) and the bow CD (the largest width of the bowing). A larger gap or bow bias (or increase thereof) means the bow CD is higher or increases more during etch of a corresponding region. Although the bowing is observed in the oxide layer, the majority of the bowing happens during etching of the SOI layer, that is, during the etching of the SOI (poly-Si) layer. Note that the bow bias jumps by 21 nm after the SOI layer etch. There is essentially no change in the bow bias during the etch of the BOX (buried oxide) layer.

Conventional techniques involve trying to control bowing during etching of the upper oxide layer. Techniques of the present invention include controlling process gas composition during etching of the SOI layer—using a nitrogen and argon composition—to control the bowing CD, in addition to varying the process chemistry during the oxide etching to provide selective over passivation of the upper oxide portion.

An example of the etch chemistry for etching the polysilicon includes using oxygen, CF4, CH2F2 for sidewall passivation, nitrogen, and argon. Simultaneously using argon and nitrogen increases the etch rate of the polysilicon, and particularly with an increased nitrogen amount, the etch rate can be increased significantly, as much as 2-3 times. By controlling the ratio of nitrogen to argon, the bowing CD can be further controlled during etch of the poly-Si layer.

Nitrogen is believed to be in part responsible for the increased bowing, but also responsible for increasing the etch rate. Reducing etch time can benefit other areas of the wafer. Around the wafer edge there can be one or more oxide area layers called an exclusion area. During the poly-Si layer etch, the exclusion area has the potential of receiving excessive etching as it is not protected by any mask. By reducing etch time of polySi from (for example) 110 s to 43 s, a thickness of the oxide layer in the edge exclusion area is improved. As noted earlier, preferably the nitrogen to argon ratio is from 0.12 to 2.0, and more preferably about 0.2 to about 0.8.

Selective over passivation can also be used to control bowing. Conventional attempts amount to reducing the argon content or increasing the polymer, but this increased polymer deposition is constant throughout etching layer processes and can result in pinched trenches.

In accordance with one of the aspects of the invention, it has been recognized that bowing is basically caused by ions being deflected and contacting the upper sidewalls, with little sidewall passivation for protection. Accordingly, the ions bombard and quickly remove the passivation layer and increase the bow CD. Techniques herein include varying levels of passivation in a given trench or hole region based on the location within the trench.

In a conventional etch process, passivation forms on sidewalls close to a lowest surface being etched. Initially the depth does not extend very far from the opening, so initially the deposition is reasonably uniform on the sidewalls. As the etch depth progresses, however, (for example, beyond 1 micron) the deposition is heaviest on the walls closest to the lower edge regions or near the bottom of the trench. After etching down a certain amount, there is no longer deposition (or small deposition) on the upper sidewalls. Sidewall deposition thickness at the bottom then becomes much thicker than at the top of the oxide layer. In addition, as ions deflect off the initial layer(s), ions bombard the upper oxide layer and etch away the sidewalls resulting in no cumulative redeposition and lateral etching occurs. The only cumulative deposition is happening at the lowest sidewall surfaces.

With the present invention, a thicker passivation layer is formed on the upper oxide sidewall surfaces. Usually the upper oxide sidewall passivation is very thin. With the present invention it has been recognized that it is advantageous to make the top of the layer thicker compared to lower sidewalls within the rest of a trench. This results in an upper sidewall thickness sufficient to resist lateral etch from ion bombardment. This thickness is at least sufficient to compensate for the lateral etch or propensity to lateral etch. In some applications, the depth of the upper bowing region is located within a depth of around 100-150 nm. In an approximately 1-2 micron (1000-2000 nm) deep trench, the bowing typically occurs within the first 100-150 nm of the depth. Etch of the oxide layer is separated into two parts. A first etch process for the first approximately 100-150 nm, and then a second etch process for the remaining 850 nm oxide etch for an oxide layer of about 1000 nm. In the first etch period, the sidewall passivation is made relatively thicker as compared to the remaining sidewall passivation, which is deposited at a generally conventional thickness. In other words, etching of the oxide layer includes a deposition rich chemistry for a first etch portion, and then an etch rich chemistry (or less deposition rich) for a remaining portion of the oxide layer. In some cases, the bowing (or at least the most significant bowing) does not occur at the very top of the very top of the oxide etch. Thus, before the first etch process, a portion of the oxide layer can be etched without using the deposition rich chemistry of the first etch process, followed by the deposition rich chemistry of the first etch process, and thereafter, the non-deposition rich (or less rich) chemistry of the second etch process in continuing to etch the oxide layer for the second etch process. Even in this case, the chemistry of the first etch process is preferably discontinued at 25% or less of the total oxide layer thickness so that the overall etch can benefit from the increased passivation provided early in the etch without encountering problems (such as pinching of the trench) that can arise if the deposition rich chemistry were used for the entire etch.

In accordance with an example of an embodiment of the invention, a method is provided for etching deep features on a semiconductor substrate. The method includes disposing a substrate on a substrate holder in a plasma processing system. The substrate has a mask pattern defining openings that expose underlying layers through which one or more high aspect ratio features are to be etched. The underlying layers include an oxide layer. The mask layer can include one or more layers. The method includes performing a first etching process that etches through a first portion of the oxide layer using a first process gas chemistry. For example, the first 100-150 nanometers of a trench or via. The first etching process also deposits a first passivation layer on sidewalls created by the first etching process (or the first process etch chemistry) in the first portion of the depth of the oxide layer. The first passivation layer has a first thickness. The method further includes performing a second etching process that etches through a second portion of the oxide layer using a second process gas chemistry or second etch chemistry. The second etching process also deposits a second passivation layer on sidewalls created by the second etching process in the second portion of the oxide layer. The second passivation layer has a second thickness that is different than the first thickness. The thickness of the first passivation layer (after the first etching process is completed) is thicker than the thickness of the second passivation layer (after the second etch process is completed).

The invention is particularly advantageous in etching trenches, but can also be used in etching other features, such as through-hole vias. In addition, the invention is particularly advantageous in forming memory devices, for example where the trenches are subsequently filled with a polymer for example to form capacitors, however, the invention can be used for other applications/devices.

Turning now to the drawings in further detail, FIG. 1 illustrates an example of an etch substrate to which the present invention is applicable. As shown, the arrangement includes a mask layer for example, with a silicon anti-reflective coating (Si-ARC) 10, beneath which is provided an amorphous carbon layer (aC) 12. Beneath the mask, an oxide layer 14 is provided, followed by a nitride or silicon nitride layer 16, beneath which is provided a polysilicon or poly-Si layer. Because the poly-Si layer is formed on an insulator, this layer is also more generally referred to as an SOI layer or silicon on insulator layer. Beneath the SOI layer in the illustrated arrangement, a buried oxide layer or BOX layer 20 is provided. Further, in the illustrated example, the above-described layers are provided on a silicon-substrate 22.

In the illustrated arrangement, the top critical dimension or CD is approximately 0.1 microns (the opening of the mask adjacent to the oxide layer or at the top of the oxide layer), and the total trench depth is approximately 1-3 microns. It is to be understood that these dimensions are provided as examples, and moreover, features of the present invention could be utilized in features other than trenches, for example, in forming vias.

As illustrated in FIG. 1, when etching progresses in such an arrangement, the oxide layer can etch laterally causing an undesirable bowing with the largest dimension of the bowing illustrated as the Bow CD in FIG. 1.

As depicted in FIG. 2, this bowing can cause adjacent trench features to contact each other or have an insufficient gap spacing between adjacent features, resulting in poor performance and potentially a short circuit. In accordance with the present invention it has been recognized, among other features, that the bowing tends to be localized in the upper portion of the oxide etch, and further, that a significant contribution, if not the most significant contribution to the bowing, occurs during the poly-SI etch or SOI etch as well as during etching of the deepest portions of the oxide etch.

As noted above, the top CD is the dimension of the opening in the mask or opening at the top of the oxide layer, while the Bow CD refers to the widest dimension of the oxide etch. These dimensions, and particularly the difference in these dimensions as etching progressed were measured to determine a Bow Bias, at different stages of an etch process, to determine when the bowing (or contributions to bowing) occurs during the etch process. The results are shown in FIG. 3, in which the Bow Bias (Bow CD minus Top CD) is shown for different times (or depths) during the etch including from left to right in FIG. 3: (1) partially through the oxide etch, (2) upon completion of the oxide etch, (3) at the completion of the nitride etch, (4) at the completion of the SOI etch, and (5) after the completion of the BOX (buried oxide layer) etch. As can be seen, the bowing begins to become significant during the later stages of the oxide etch, as is apparent from a comparison of the partial oxide etch and the completion of the oxide etch. The bowing continues to increase during the nitride etch. However, the most significant increase in the bowing can occur during the SOI etch, with an increase in the amount of bowing of 21 nm during the SOI etch (with the change of the Bow Bias from 20 nm to 41 nm). Thus, in accordance with one of the advantageous features of the invention, in addition to providing a process which reduces bowing occurring during the oxide etch, the present invention also reduces or minimizes the contribution to bowing which can occur during the SOI etch.

Referring to FIGS. 4A and 4B, an explanation of bowing during the oxide etch will be provided. As shown in FIG. 4A, during the initial phase of oxide etching, a passivation layer, such as a fluorocarbon based passivation layer 30 is formed. During initial etching as ions bombard the bottom of the trench, portions of the passivation layer or polymers at the bottom of the trench become displaced and deposited (or redeposited) on the side wall as indicated by arrow A. However, this redeposition occurs relatively close to the bottom of the trench. Thus, as shown in FIG. 4B, as etching progresses through oxide layer 14', although redeposition of the passivation layer or polymers can occur close to the bottom of the trench, it does not occur in areas closer to the top of the trench. In addition, ions incident at the side wall toward the top of the trench cause a loss of the passivation layer deposited in the early portion of the etching and lateral etching can progress, which is not compensated for by redeposition because, as noted above, the redeposition of polymers and flurocarbons occurs, close to the bottom of the trench. Accordingly, the bowing will occur toward the top of the trench. The problem with lateral etching can become further problematic as a result of the faceting of the mask layer, which can cause more ions to become incident upon the side wall in the upper region of the trench. Although measures could be taken with regard thinning or faceting of the mask by altering the dimensions or other processing (deposition) of the mask, often the dimensions and features of the mask are a fixed parameter which cannot be adjusted. In FIG. 4B, the SiARC layer is omitted as it has typically been etch away at this point. In addition, the layer under the SiARC layer is identified more generally as an OPL (organic planarization layer), whereas FIG. 1 illustrated an amorphous carbon layer (a type of OPL). It is to be understood that various types of masks/mask layers can be used.

The above in combination with the recognition of the data obtained in conjunction with the discussion of FIG. 3 makes apparent that bowing is problematic in the upper region of the oxide etch. In addition, the bowing in the upper region of the oxide etch primarily occurs during etching of the lower portion of the oxide etch and also during etching of the poly-Si or SOI layer.

In accordance with the present invention, it has been recognized that the bowing can be reduced by providing a thicker passivation layer during the initial portions of the etch, for example during etching of 25% or less of the depth of the oxide etch, with the remainder of the oxide etch being less rich in the gas chemistry in terms of formation of a passivation layer on the side walls of the etch. Thus a first thickness of the passivation layer is formed during the initial portion of the etch, and thereafter, during the second portion of the oxide etch a second thickness of passivation layer is formed which is smaller than the first thickness. As a result, during the etching of the second portion of the oxide layer or during the second process step, loss of the passivation layer in the upper portion of the oxide layer is accommodated by the additional thickness of the passivation layer (formed during etching of the first portion of the depth) thereby avoiding or minimizing the occurrence of bowing. Examples of process chemistries are provided hereinafter.

In accordance with yet another feature of the invention, it has been recognized that an additional way to reduce bowing in the upper portion of the oxide etch is by modifying the etch chemistry during the poly-Si etch or SOI etch. In particular, during the poly-Si etch, typically argon or nitrogen are utilized during a portion of the etch, however, the invention recognizes that by utilizing both argon and nitrogen simultaneously, the speed of the poly-Si etch (which typically is relatively slow) can be significantly accelerated, and further, that by reducing the time for the SOI etch, the amount of bowing which can occur or the propensity for bowing in the oxide layer during the SOI etch is reduced. Thus, in accordance with an additional feature of the invention, during at least a portion of the SOI etch, both nitrogen and argon are provided in the process gas or plasma gas simultaneously. For example, by using both argon and nitrogen simultaneously (e.g. with a nitrogen to argon ratio of 0.2 to 0.8), the etch rate can be significantly increased, for example by a factor of 2-3 times, and the contribution to bowing which might otherwise occur during the SOI etch is thereby reduced. By way of example, the time to etch through a 80-100 nm thick polysilicon layer can be reduced from 110 seconds to 44 seconds using a chemistry of $N_2/Ar/CH_2F_2/O_2$. As discussed earlier, the nitrogen to argon ratio is preferably from about 0.12 to 2.0, and more preferably from about 0.2 to 0.8. Further, by way of example, flow rates of argon can be 150-250 SCCM (standard cubic centimeters per minute) with N2 flow rates of 30-80 SCCM. It is to be understood, however, that flow rates can vary depending upon the process and chamber used. Thus, although these flow rates have been advantageously used, other flow rates are possible. In addition, also by way of example, the percentage, in terms of total gas flow of process gases entering the process chamber, of argon advantageously can be 40-60% (e.g., 49%) with $N_2$ of 10-20% (e.g., 14%). Reducing the etch time of the polysilicon layer to less than 100 seconds, and preferably to less than 50 seconds, advantageously reduces the bowing in the oxide layer.

As illustrated in FIGS. 5A and 5B where a deposition rich chemistry is utilized (at FIG. 5A), the amount of bowing which occurs is significantly less than where a non-deposition rich or less deposition rich chemistry is used (at FIG. 5B). In this regard, it should be noted that even a slight even reduction of 10 nm in the bowing (from 120 nm to 110 nm) can be extremely significant as it is sufficient to prevent or minimize the possibility of adjacent bowing portions of adjacent trenches from contacting each other or resulting in an unacceptable gap spacing. Moreover, the ability to reduce bowing can be further enhanced by accelerating the etch of the SOI layer as discussed earlier.

Table 1 below provides examples of process of chemistries for a first processing step or step one utilized for etching the upper portion or an initial portion of an oxide layer, with corresponding chemistries provided on the same row of Table 1 for the second etching step or step two, utilized for etching the lower portions of the oxide layer. With these chemistries, a thicker passivation layer will form in the upper portion of the oxide layer (as considered at the time of completion of the etching of the upper portion) as compared with the thickness of the passivation layer on the sidewall at the lower portion of the etched oxide trench upon completion of the oxide layer etching.

As discussed earlier, in accordance with one of the features of the invention, the bowing typically occurs in the upper region of the oxide layer, and therefore, the step one process chemistry is used for approximately 25% or less of the total etch depth. By way of example, with a 1000 micron total oxide layer depth, the first process chemistry can be utilized for the plasma in the first 150 nm of the etch while the second process chemistry can be used for the plasma in the remaining 850 nm of the etch.

TABLE 1

Step 1

C4F6/O2/Ar
C4F6/O2/Ar
C4F6/O2/Ar
C4F6/O2/Ar
C4F6/O2/Ar

TABLE 1-continued

C4F6/Ar
C4F6/Ar/CO
C4F6/Ar/H2 (e.g., 50-100 SCCM)
C4F6/Ar/O2
C4F6/Ar/H2
C4F6/Ar/O2
C4F8/Ar/O2/CH2F2
C4F8/Ar/O2/CH3F
C4F6/Ar/N2/CO
C4F6/Ar/H2
C4F6/Ar
CF4/CH3F/Ar/O2
C4F6/Ar/O2

Step 2

Decreased C4F6/O2/Ar
C4F6/Increased O2/Ar
C4F6/O2/Ar/CH2F2
C4F6/O2/Ar/N2
C4F6/Ar/N2
C4F6/Ar/O2
C4F6/Ar/O2
C4F6/Ar/Decreased H2 (e.g, 10-50 SCCM)
C4F6/Ar/H2 (e.g., 10-50 SCCM)
C4F6/Ar/H2/N2
C4F8/Ar/O2
C4F8/Ar/O2
C4F8/Ar/Increased O2
C4F6/Ar/N2/CO/O2
C4F6/O2/N2
C4F6/Ar/O2/N2
CF4
CF4/Ar/O2

It is to be understood that the above process chemistries are provided as examples and that alternate process chemistries could be utilized. By way of example, $CHF_3$ and $C_3F_8$ could be utilized in the first step or second step, and $CH_3F$ (identified above on the first step) could be also used in the second step. The first process chemistry forms a thicker passivation layer in the first process step during plasma etching than the second process chemistry in the second processing step. Further, the first process chemistry is utilized for approximately 25 percent or less, and more preferably about 15 percent or less of the depth of the total oxide layer etch. In addition, where there is subsequent etching of a poly-Si or SOI layer, further advantageous results are achieved by accelerating the SOI etch, and preferably by utilizing argon and nitrogen simultaneously at a controlled ratio in the plasma etching for at least a portion of the SOI etch or for the entire SOI etch.

Although several embodiments or examples have been described in detail above, those skilled in the art will readily appreciate that many modifications are possible in the embodiments without materially departing from the novel teachings and advantages of described techniques. Accordingly, all such modifications are included within the scope of the present disclosure and claims.

What is claimed:

1. A method for etching features on a semiconductor substrate, the method comprising:
   disposing a substrate on a substrate holder in a plasma processing system, the substrate having a mask pattern defining openings that expose underlying layers through which one or more features are to be etched, the underlying layers including an oxide layer;
   performing a first etching process that etches through a first portion of the oxide layer using a first process gas chemistry, the first etching process also depositing a first passivation layer on sidewalls created by the first etching process in the first portion of the oxide layer, the first passivation layer having a first thickness;

performing a second etching process that etches through a second portion of the oxide layer using a second process gas chemistry, the second etching process depositing a second passivation layer on sidewalls created by the second etching process in the second portion of the oxide layer, and wherein the second etching process includes forming the second passivation layer to have a second thickness that is different than the first thickness;

wherein the underlying layers include a polysilicon layer under the oxide layer, and wherein the method further comprises performing a third etching process that etches through the polysilicon layer, wherein the third etching process includes etching with a third process gas chemistry that simultaneously includes both nitrogen and argon.

2. The method of claim 1, wherein the first thickness of the first passivation layer is greater than the second thickness of the second passivation layer.

3. The method of claim 2, wherein the performing the first etching process to etch through the first portion of the oxide layer includes etching less than about 25% of a total depth of the oxide layer measured from the mask pattern, and wherein the performing of the second etching process to etch through the second portion of the oxide layer includes etching through a remaining portion of the oxide layer after etching less than about 25% of the total depth of the oxide layer in the first etching process.

4. The method of claim 1, wherein performing the first etching process comprises using a first plasma etching process with a first process gas chemistry;

wherein performing the second etching process comprises using a second plasma etching process with a second process gas chemistry different from the first process gas chemistry; and wherein the first process gas chemistry provides a higher ratio of deposition species as compared to the second process gas chemistry.

5. The method of claim 4, wherein using the first plasma etching process includes generating a plasma from one or more gases selected from the group consisting of $C_4F_6$, $C_4F_8$, $CF_4$, Ar, $N_2$, $O_2$, $CH_2F_2$, $CHF_3$, $CH_3F$, $H_2$, and $C_3F_8$; and wherein using the second plasma etching process includes generating a plasma from one or more gases selected from the group consisting of $C_4F_6$, $C_4F_8$, $CF_4$, Ar, $N_2$, $O_2$, $CH_2F_2$, $CHF_3$, $CH_3F$, $H_2$, and $C_3F_8$.

6. The method of claim 1, wherein the etching is used in fabricating a memory device.

7. The method of claim 1, further comprising filling etched trenches with a polysilicon material.

8. The method of claim 1, wherein the feature to be etched has a top width between about 25-100 nanometers, and wherein the depth to be etched is between about 1000-3000 nanometers.

9. The method of claim 8, wherein depositing the first passivation layer includes depositing the first passivation layer on sidewalls to a depth of about 100-150 nanometers measured from the mask pattern.

10. The method of claim 1, wherein the mask pattern defines a plurality of adjacent openings for etching trenches.

11. The method of claim 1, wherein the mask pattern includes an anti-reflective coating layer.

12. The method of claim 1, wherein a ratio of nitrogen to argon during the third etching process is between about 0.12 to 2.0.

13. The method of claim 1, wherein the ratio of nitrogen to argon during the third etching process is between about 0.2 to 0.8.

14. The method of claim 1, wherein the substrate includes an amorphous carbon layer above the oxide layer.

15. The method of claim 1, wherein the underlying layers include an oxide insulating layer under the polysilicon layer.

16. The method of claim 1, wherein the underlying layers include a nitride layer above the polysilicon layer and below the oxide layer.

17. The method of claim 16, wherein the underlying layers further include an oxide insulating layer beneath the polysilicon layer.

18. The method of claim 1, wherein the oxide layer etched with the first etching processing and the second etching processing is a first oxide layer, wherein the substrate includes a nitride layer beneath the first oxide layer, wherein the polysilicon layer is beneath the nitride layer, and wherein a second oxide layer is beneath the polysilicon layer, and wherein the method includes:

after etching of the first oxide layer with the first etching processing and the second etching processing, etching the nitride layer, the polysilicon layer, and the second oxide layer; and wherein nitrogen and argon are used in etching the polysilicon layer in a ratio of nitrogen to argon of about 0.2 to 0.8.

* * * * *